(12) United States Patent
Kossel et al.

(10) Patent No.: US 8,638,149 B1
(45) Date of Patent: Jan. 28, 2014

(54) EQUALIZED RISE AND FALL SLEW RATES FOR A BUFFER

(75) Inventors: Marcel A. Kossel, Reichenburg (CH); Daihyun Lim, West New York, NJ (US); Pradeep Thiagarajan, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/567,214

(22) Filed: Aug. 6, 2012

(51) Int. Cl.
*H03K 5/12* (2006.01)

(52) U.S. Cl.
USPC ............................................ 327/170; 327/108

(58) Field of Classification Search
USPC ......... 327/170, 172, 174–176, 134, 108–112, 327/165, 379, 387, 538, 543, 154–156; 326/26–27, 82–83
See application file for complete search history.

(56) References Cited

U.S. PATENT DOCUMENTS

| | | | |
|---|---|---|---|
| 5,336,940 A * | 8/1994 | Sorrells et al. ................. | 327/276 |
| 6,172,541 B1 | 1/2001 | Young et al. | |
| 6,271,699 B1 | 8/2001 | Dowlatabadi | |
| 6,362,672 B1 * | 3/2002 | Geist ............................. | 327/170 |
| 6,646,483 B2 | 11/2003 | Shin | |
| 6,777,974 B2 * | 8/2004 | Eichfeld et al. ................. | 326/26 |
| 6,903,589 B2 | 6/2005 | Kim | |
| 7,109,768 B2 | 9/2006 | Rashid | |
| 7,518,424 B2 | 4/2009 | Yeh | |
| 7,598,784 B2 * | 10/2009 | Hunter .......................... | 327/170 |
| 7,663,418 B2 * | 2/2010 | Dale et al. ...................... | 327/170 |
| 7,755,413 B2 | 7/2010 | Wong | |
| 7,808,268 B2 | 10/2010 | Bucossi et al. | |
| 2002/0030523 A1 | 3/2002 | Muljono et al. | |
| 2006/0152261 A1 | 7/2006 | Lance | |

\* cited by examiner

*Primary Examiner* — Lincoln Donovan
*Assistant Examiner* — Thomas Skibinski
(74) *Attorney, Agent, or Firm* — David A. Cain; Hoffman Warnick LLC

(57) ABSTRACT

Aspects of the invention provide for equalizing rise and fall slew rates at an output for a buffer. In one embodiment, a method includes: measuring, simultaneously, rise and fall slew rates at an input of the buffer and rise and fall slew rates at the output of the buffer; generating a slew reference based on at least one of the rise slew rate or the fall slew rate at the input of the buffer; comparing the rise slew rate and the fall slew rate at the output of the buffer to the slew reference; and generating at least one of a rise control signal or a fall control signal for adjusting at least one of the rise slew rate or the fall slew rate at the output of the buffer.

20 Claims, 6 Drawing Sheets

US 8,638,149 B1

EQUALIZED RISE AND FALL SLEW RATES FOR A BUFFER

BACKGROUND OF THE INVENTION

The subject matter disclosed herein relates generally to integrated circuits. More specifically, the disclosure provided herein relates to a method and structure for equalizing rise and fall slew rates for a buffer.

The rise and fall slew rate (transitions) of a clocking signal can affect the switching threshold of a transistor's operation in circuits. A mismatched rise and fall slew rate can lead to undesired duty cycle propagation for the clock signal through critical paths. For example, with input/output drivers and phase interpolators, a mismatched rise and fall slew rate can lead to timing errors and unwanted results.

BRIEF DESCRIPTION OF THE INVENTION

Aspects of the invention provide for equalizing rise and fall slew rates at an output for a buffer. In one embodiment, a method includes: measuring, simultaneously, rise and fall slew rates at an input of the buffer and rise and fall slew rates at the output of the buffer; generating a slew reference based on at least one of the rise slew rate or the fall slew rate at the input of the buffer; comparing the rise slew rate and the fall slew rate at the output of the buffer to the slew reference; and generating at least one of a rise control signal or a fall control signal for adjusting at least one of the rise slew rate or the fall slew rate at the output of the buffer.

A first aspect of the invention provides a method for equalizing rise and fall slew rates at an output of a buffer, the method comprising: measuring, simultaneously, rise and fall slew rates at an input of the buffer and rise and fall slew rates at the output of the buffer; generating a slew reference based on at least one of the rise slew rate or the fall slew rate at the input of the buffer; comparing the rise slew rate and the fall slew rate at the output of the buffer to the slew reference; and generating at least one of a rise control signal or a fall control signal for adjusting at least one of the rise slew rate or the fall slew rate at the output of the buffer.

A second aspect of the invention provides computer program comprising program code embodied in at least one computer-readable medium, which when executed, enables a computer system to implement a method of equalizing rise and fall slew rates at an output of a buffer, the method comprising: measuring, simultaneously, rise and fall slew rates at an input of the buffer and rise and fall slew rates at the output of the buffer; generating a slew reference based on at least one of the rise slew rate or the fall slew rate at the input of the buffer; comparing the rise slew rate and the fall slew rate at the output of the buffer to the slew reference; and generating at least one of a rise control signal or a fall control signal for adjusting at least one of the rise slew rate or the fall slew rate at the output of the buffer.

A third aspect of the invention provides a system for equalizing rise and fall slew rates at an output of a buffer, the system comprising: a buffer including a signal input, a signal output, and two control inputs; a pair of slew rate circuits for measuring, simultaneously, rise and fall slew rates at an input of the buffer and rise and fall slew rates at the output of the buffer; a slew reference circuit for generating a slew reference based on at least one of the rise slew rate or the fall slew rate at the input of the buffer; a slew compare circuit for comparing the rise slew rate and the fall slew rate at the output of the buffer to the slew reference; and a control signal circuit for generating at least one of a rise control signal or a fall control signal for the two control inputs of the buffer, wherein the rise control signal and the fall control signal adjust the rise slew rate and the fall slew rate, respectively, at the output of the buffer.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As mentioned above, the subject matter disclosed herein relates generally to integrated circuits. More specifically, the disclosure provided herein relates to a method and structure for equalizing rise and fall slew rates for a buffer.

The rise and fall slew rate (transitions) of a clocking signal can affect the switching threshold of a transistor's operation in circuits. A mismatched rise and fall slew rate can lead to undesired duty cycle propagation for the clock signal through critical paths. For example, with input/output drivers and phase interpolators, a mismatched rise and fall slew rate can lead to timing errors and unwanted results.

Aspects of the invention provide for equalizing rise and fall slew rates at an output for a buffer. In one embodiment, a method includes: measuring, simultaneously, rise and fall slew rates at an input of the buffer and rise and fall slew rates at the output of the buffer; generating a slew reference based on at least one of the rise slew rate or the fall slew rate at the input of the buffer; comparing the rise slew rate and the fall slew rate at the output of the buffer to the slew reference; and generating at least one of a rise control signal or a fall control signal for adjusting at least one of the rise slew rate or the fall slew rate at the output of the buffer. The rise control signal and/or fall control signal will appropriately adjust the rise slew rate and/or the fall slew rate for an output signal of the buffer, such that the rise slew rate and the fall slew rate of the output signal are equalized.

Figure 1:
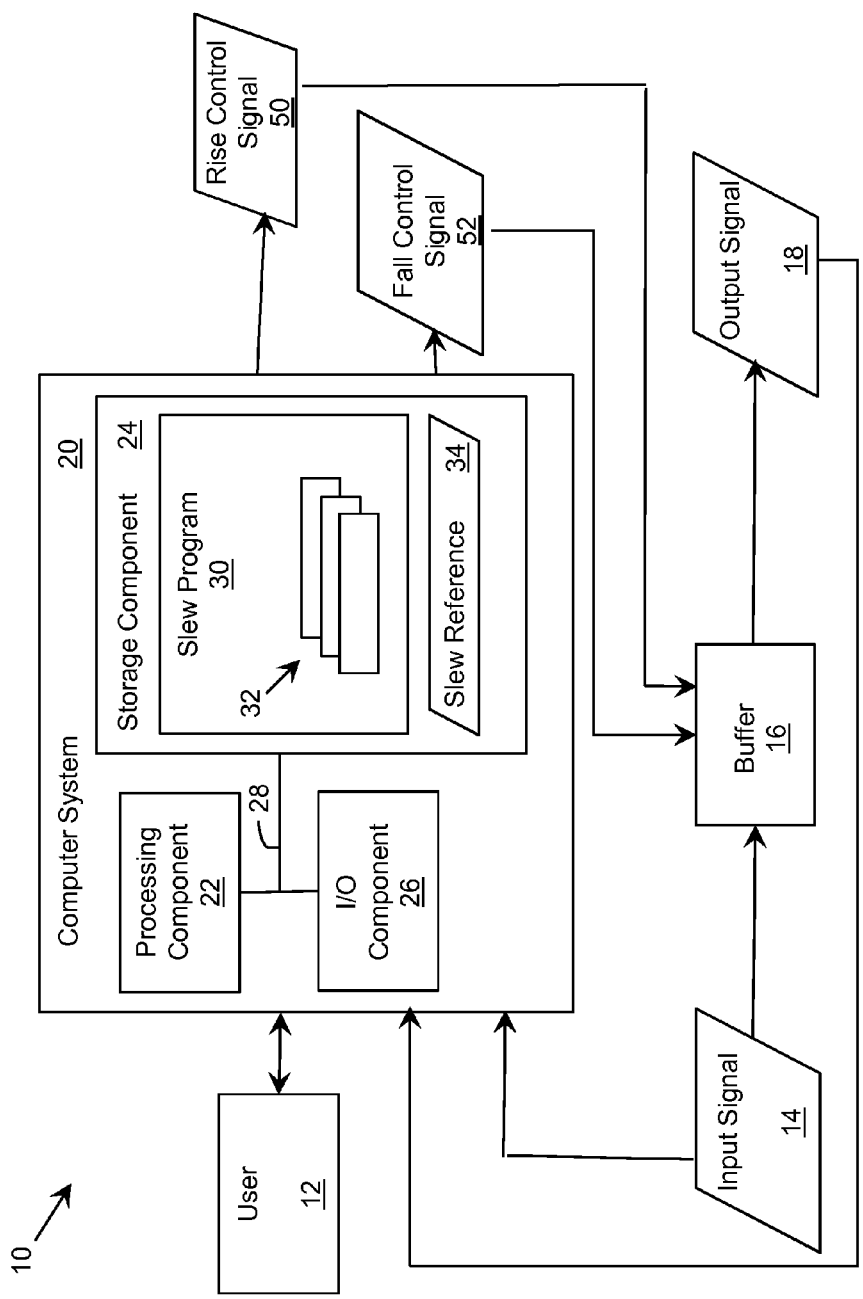
FIG. 1 shows an illustrative environment according to embodiments of the invention.

Turning now to FIG. 1, an illustrative environment 10 for equalizing rise and fall slew rates of a buffer 16 according to embodiments of the invention is shown. To this extent, environment 10 includes a computer system 20 that can perform a process described herein in order to equalize rise and fall slew rates at an output of the buffer 16. In particular, computer system 20 is shown including a slew program 30, which makes computer system 20 operable to equalize rise and fall slew rates at an output of the buffer 16 by performing the process described below with respect to FIGS. 2-5.

Computer system 20 is shown including a processing component 22 (e.g., one or more processors), a storage component 24 (e.g., a storage hierarchy), an input/output (I/O) component 26 (e.g., one or more I/O interfaces and/or devices), and a communications pathway 28. In general, processing component 22 executes program code, such as slew program 30, which is at least partially fixed in storage component 24. While executing program code, processing component 22 can process data, which can result in reading and/or writing transformed data from/to storage component 24 and/or I/O component 26 for further processing. Pathway 28 provides a communications link between each of the components in computer system 20. I/O component 26 can comprise one or more human I/O devices, which enable a human user 12 to interact with computer system 20 and/or one or more communications devices to enable a system user 12 to communicate with computer system 20 using any type of communications link. To this extent, slew program 30 can manage a set of interfaces (e.g., graphical user interface(s), application program interface, and/or the like) that enable human and/or system users 12 to interact with slew program 30. Further, slew program 30 can manage (e.g., store, retrieve, create, manipulate, organize, present, etc.) the data, such as a slew reference voltage 34, using any solution.

In any event, computer system 20 can comprise one or more general purpose computing articles of manufacture (e.g., computing devices) capable of executing program code, such as slew program 30, installed thereon. As used herein, it is understood that "program code" means any collection of instructions, in any language, code or notation, that cause a computing device having an information processing capability to perform a particular action either directly or after any combination of the following: (a) conversion to another language, code or notation; (b) reproduction in a different material form; and/or (c) decompression. To this extent, slew program 30 can be embodied as any combination of system software and/or application software.

Further, slew program 30 can be implemented using a set of modules 32. In this case, a module 32 can enable computer system 20 to perform a set of tasks used by slew program 30, and can be separately developed and/or implemented apart from other portions of slew program 30. As used herein, the term "component" means any configuration of hardware, with or without software, which implements the functionality described in conjunction therewith using any solution, while the term "module" means program code that enables a computer system 20 to implement the actions described in conjunction therewith using any solution. When fixed in a storage component 24 of a computer system 20 that includes a processing component 22, a module is a substantial portion of a component that implements the actions. Regardless, it is understood that two or more components, modules, and/or systems may share some/all of their respective hardware and/or software. Further, it is understood that some of the functionality discussed herein may not be implemented or additional functionality may be included as part of computer system 20.

When computer system 20 comprises multiple computing devices, each computing device can have only a portion of slew program 30 fixed thereon (e.g., one or more modules 32). However, it is understood that computer system 20 and slew program 30 are only representative of various possible equivalent computer systems that may perform a process described herein. To this extent, in other embodiments, the functionality provided by computer system 20 and slew program 30 can be at least partially implemented by one or more computing devices that include any combination of general and/or specific purpose hardware with or without program code. In each embodiment, the hardware and program code, if included, can be created using standard engineering and programming techniques, respectively.

Regardless, when computer system 20 includes multiple computing devices, the computing devices can communicate over any type of communications link. Further, while performing a process described herein, computer system 20 can communicate with one or more other computer systems using any type of communications link. In either case, the communications link can comprise any combination of various types of optical fiber, wired, and/or wireless links; comprise any combination of one or more types of networks; and/or utilize any combination of various types of transmission techniques and protocols.

As discussed herein, slew program 30 enables computer system 20 to equalize rise and fall slew rates at an output of buffer 16 (e.g., generate a rise control signal 50 and/or a fall control signal 52 for buffer 16 to equalize the rise and fall slew rates of an output signal 18). To this extent, computer system 20 may perform the method according to aspects of the invention, as discussed herein with respect to FIGS. 2-5.

Figure 2:
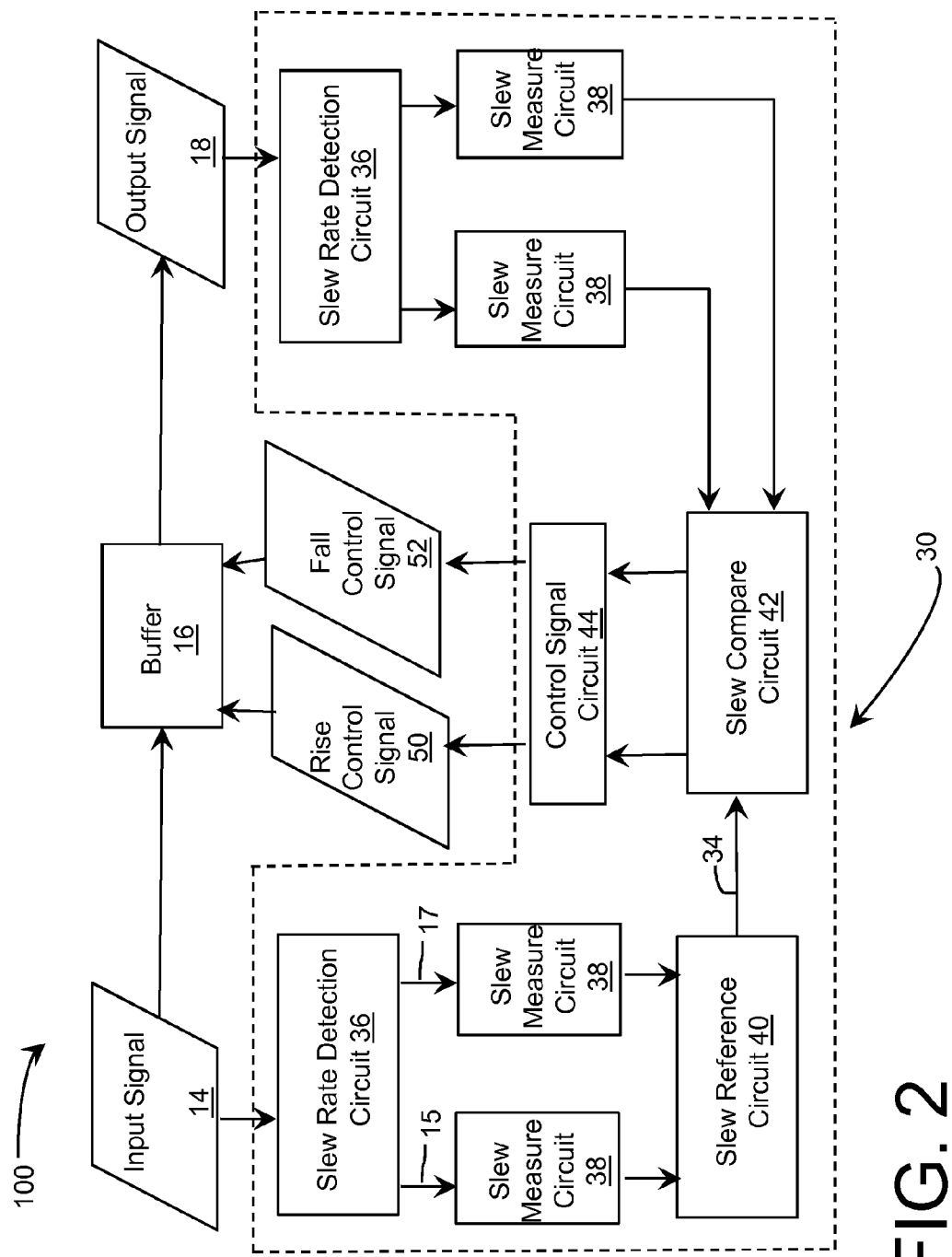
FIG. 2 shows a block diagram of a system according to embodiments of the invention.
Figure 3:
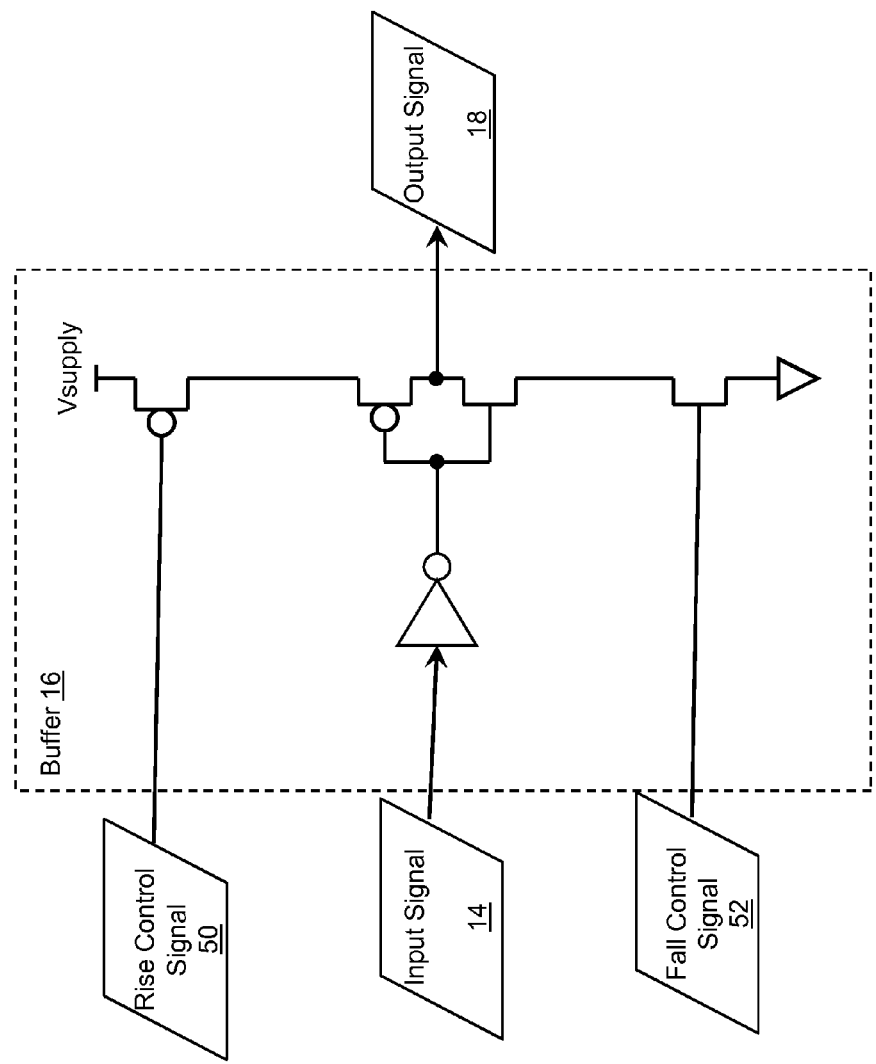
FIG. 3 shows a block diagram of a buffer according to embodiments of the invention.

Turning now to FIG. 2, a block diagram of a system 100 for equalizing rise and fall slew rates at an output (i.e., for output signal 18) of buffer 16, using slew program 30. Buffer 16 includes a signal input for input signal 14, a signal output for output signal 18, and two control inputs for a rise control signal 50 and a fall control signal 52. As shown in FIG. 3, an example of a buffer 16 according to embodiments of the invention is shown. Buffer 16 shown in FIG. 3 is a current controlled buffer. However, it is understood that the example of buffer 16 shown in FIG. 3 is for exemplary purposes only and other architectures are possible. Buffer 16 only requires an independent rail pull-up (controlled by rise control signal 50) and rail pull-down (controlled by fall control signal 52).

System 100 also includes a pair of slew rate circuits (i.e., slew rate detection circuit 36 and slew measure circuits 38) for, simultaneously, measuring the rise and fall slew rates of an input signal 14 and an output signal 18. Slew rate detection circuit 36 detect the rise slew rate and the fall slew rate in a time domain. Slew measure circuits 38 generate a voltage representation of the rise slew rate and the fall slew rate in the time domain.

Slew rate detection circuits 36 may be implemented, for example, by a plurality of level comparators in order to detect, based on a high reference voltage and a low reference voltage, the rise slew rate and the fall slew rate in a time domain. The high reference voltage and the low reference voltage are generated by voltage generator circuit, as known in the art. For example, a voltage generator circuit may be a resistor divider. The high reference voltage and the low reference voltage are each a division factor of a power supply voltage (Vsupply) that is provided to system 100. For example, the high reference voltage may be 90% of Vsupply and the low reference voltage may be 10% of Vsupply. These values may be used as references to determine the rise and fall slew rates in the time domain of the input signal 14 and the output signal 18.

Slew rate measure circuits 38 may be implemented, for example, by creating a pulse of width during the detected time interval using latching schemes followed by converting that time information to a voltage information using integration techniques followed by sample-hold. Hence, slew rate measurement circuits 38 create a time to voltage domain conversion information on slew-rate. An example would be using SR latch, as known in the art. Therefore, the width of the pulse in time domain can now be processed by an integrator circuit that charges up a voltage linearly for the width of the pulse, followed by sampling the voltage at pulse's fall transition.

Figure 4:
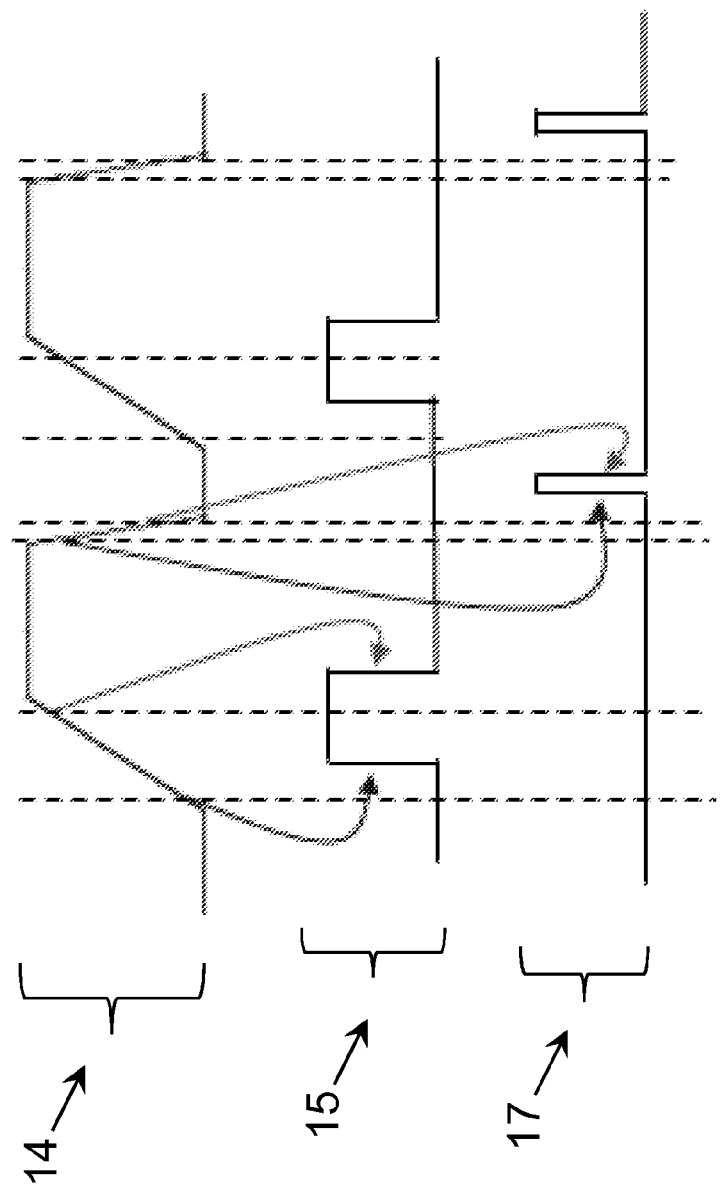
FIG. 4 shows a waveform diagram according to embodiments of the invention.

Turning now to FIG. 4, a waveform diagram according to embodiments of the invention is shown. Input signal 14 includes a rise slew rate that is different from a fall slew rate. The high reference voltage and low reference voltage, as described above, are used to determine a rise slew rate in a time domain 15 and a fall slew rate in a time domain 17. Waveform 15 is a pulse created with width equal to the rise time of input signal 14 with some delay equivalent to the propagation delay of the slew rate detection circuit 36. Waveform 17 is a pulse created with width equal to the fall time of input signal 14 with some delay equivalent to the propagation delay of the slew rate detection circuit 36. As clearly seen, the rise slew rate in the time domain 15 is slower than the fall slew rate in the time domain 17. In FIG. 2, slew measurement circuit 38 generates a voltage representation of the rise slew rate 15 and the fall slew rate 17.

Turning back to FIG. 2, system 100 also includes a slew reference circuit 40 for generating a slew reference 34 (FIG. 1) that is based on at least one of the rise slew rate 15 or the fall slew rate 17 of the input signal 14 of the buffer 16. Slew reference 34 may be defined by user 12, and can be application dependent. For example, slew reference 34 may be the rise slew rate 15, or may be the fall slew rate 17. Alternatively, the slew reference 34 may be an average of the rise slew rate 15 and the fall slew rate 17.

A slew compare circuit 42 compares the slew reference 34 (FIG. 1) generated by slew reference circuit 40 to the rise slew rate and the fall slew rate of the output signal 18 (from slew measurement circuits 38). Based on the comparison of slew compare circuit 42, a control signal circuit 44 generates at least one of the rise control signal 50 or the fall control signal 52 for the two control inputs of the buffer 16.

Control signals 50, 52 are set during a "reset" mode of system 100 to any voltage that will ensure that buffer 16 can function as a buffer. In operation, the rise control signal 50 and the fall control signal 52 will adjust the rise slew rate and the fall slew rate of the output signal 18 to appropriately equalize the rise and fall slew rate of the output signal. The slew compare circuit 42, for example, may be implemented with comparator circuits that compare two analog voltages and produce an output signal with magnitude and/or polarity information. This information may then be used by the control circuit 44 to decide on the magnitude and polarity of the rise control signal 50 and fall control signal 52. The control signal circuit 44 may include, for example, a charge pump in series with a filter for each control signal 50, 52. Each charge pump would increase or decrease the charge (hence voltage) for each control signal 50, 52.

Figure 5:
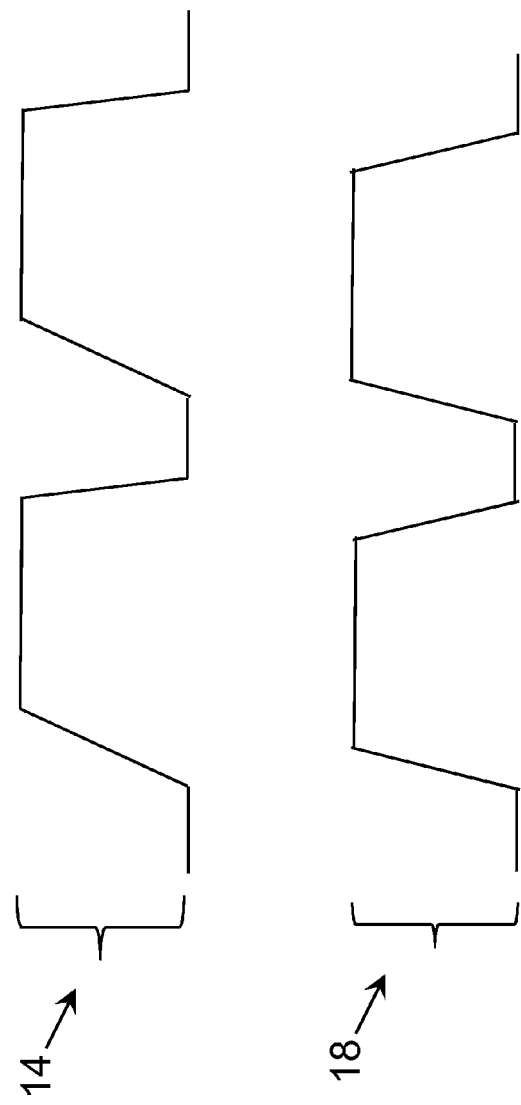
FIG. 5 shows a waveform diagram according to embodiments of the invention.

System 100 is a closed loop system that will continuously operate to incrementally adjust the rise and fall slew rates of output signal 18, until the rise and fall slew rates of output signal 18 are equal to the rise and fall slew rates of input signal 14. For example, as seen in FIG. 5, a waveform diagram illustrating an example of an input signal 14 and a corresponding output signal 18 after system 100 continually operated to equalize the rise and fall slew rates.

Figure 6:
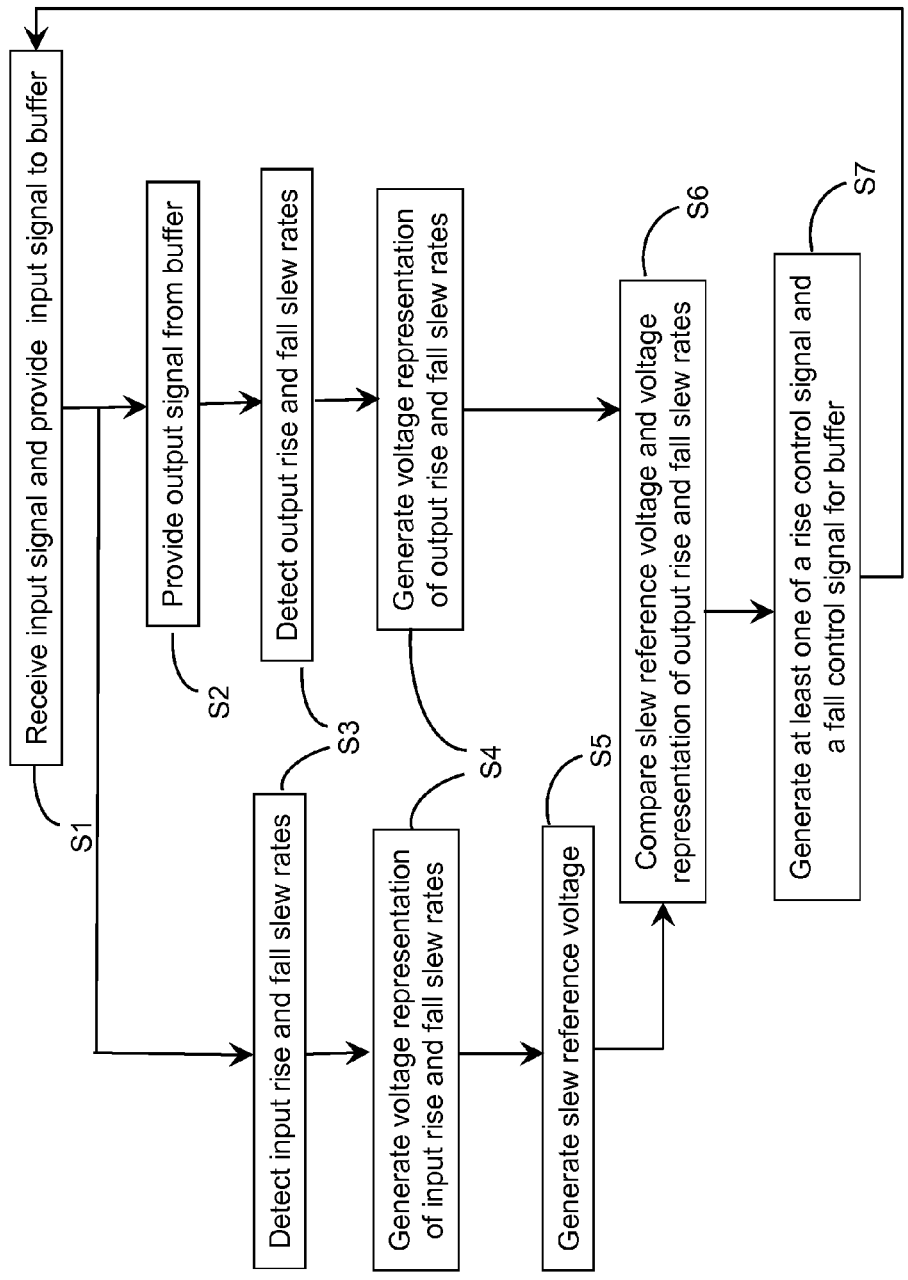
FIG. 6 shows a flow diagram according to embodiments of the invention.

Turning now to FIG. 6, a flow diagram according to embodiments of the invention is shown for equalizing rise and fall slew rates of an output signal 18 from a buffer 16 using system 100 (slew program 30). At S1, an input signal 14 is received and provided to buffer 16. At S2, an output signal 18 is outputted by buffer 16. At S3-S4, the input rise and fall slew rates and the output rise and fall slew rates are simultaneously detected, via slew rate detection circuit 36 (FIG. 2), and the voltage representation of the input rise and fall slew rates and the output rise and fall slew rates are generated, via slew measurement circuits 38 (FIG. 2).

At S5, a slew reference voltage 34 (FIG. 1) is generated, via slew reference circuit 40 (FIG. 2), that is based on the input rise and fall slew rates. At S6, this slew reference voltage 34 is compared to the voltage representation of the output rise and fall slew rates, via slew compare circuit 42 (FIG. 2). At S7, control circuit 44 (FIG. 2) generates at least one of a rise control signal 50 and a fall control signal 52, based on the comparison of slew compare circuit 42, for buffer 16, in order to adjust the output signal 18. In this way, the rise and fall slew rates of the output signal 18 are adjusted by rise control signal 50 and/or fall control signal 52, in order to equalize the rise and fall slew rates of the output signal 18.

System 100 (FIG. 2) is a closed loop system, and will repeatedly loop through the flow diagram shown in FIG. 6 until the rise slew rate and fall slew rate of output signal 18 (in FIG. 1) equals the reference signal generated by Slew Reference 34 (in FIG. 1). System 100, being a closed loop system, if there are any changes to the profile of input signal 14 that would alter the reference signal 34 due to any reason (such as voltage/temperature changes or drifts, input signal profile changes such as frequency/duty cycle/slew rates) then the system 100 will automatically look to calculate the new reference signal 34 and re-adjust the output rise and fall slew rates for output signal 18 accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for equalizing rise and fall slew rates at an output of a buffer, the method comprising:

measuring, simultaneously, rise and fall slew rates at an input of the buffer and rise and fall slew rates at the output of the buffer, wherein the input of the buffer is a signal input and the output of the buffer is an output for the signal;

generating a slew reference based on at least one of the rise slew rate or the fall slew rate at the input of the buffer;

comparing the rise slew rate and the fall slew rate at the output of the buffer to the slew reference; and generating at least one of a rise control signal or a fall control signal for adjusting at least one of the rise slew rate or the fall slew rate at the output of the buffer, to cause the rise slew rate to equal the fall slew rate at the output of the buffer.

2. The method of claim 1, wherein measuring further comprises:
   detecting, based on a high reference voltage and a low reference voltage, the rise slew rate and the fall slew rate in a time domain; and
   generating a voltage representation of the rise slew rate and the fall slew rate in the time domain.

3. The method of claim 2, further comprising:
   generating the high reference voltage and the low reference voltage, based on a supply voltage.

4. The method of claim 1, wherein the slew reference is an average of the rise slew rate and the fall slew rate at the input of the buffer.

5. The method of claim 1, wherein the slew reference is the rise slew rate at the input of the buffer.

6. The method of claim 1, wherein the slew reference is the fall slew rate at the input of the buffer.

7. The method of claim 1, wherein the buffer is an independent rail pull up and rail pull down buffer.

8. A computer program comprising program code embodied in at least one non-transitory computer-readable medium, which when executed, enables a computer system to implement a method of equalizing rise and fall slew rates at an output of a buffer, the method comprising:
   measuring, simultaneously, rise and fall slew rates at an input of the buffer and rise and fall slew rates at the output of the buffer, wherein the input of the buffer is a signal input and the output of the buffer is an output for the signal;
   generating a slew reference based on at least one of the rise slew rate or the fall slew rate at the input of the buffer;
   comparing the rise slew rate and the fall slew rate at the output of the buffer to the slew reference; and
   generating at least one of a rise control signal or a fall control signal for adjusting at least one of the rise slew rate or the fall slew rate at the output of the buffer, wherein the at least one of the rise control signal or the fall control signal causes the rise slew rate to equal the fall slew rate at the output of the buffer.

9. The computer program of claim 8, wherein measuring further comprises:
   detecting, based on a high reference voltage and a low reference voltage, the rise slew rate and the fall slew rate in a time domain; and
   generating a voltage representation of the rise slew rate and the fall slew rate in the time domain.

10. The computer program of claim 9, further comprising:
    generating the high reference voltage and the low reference voltage, based on a supply voltage.

11. The computer program of claim 8, wherein the slew reference is an average of the rise slew rate and the fall slew rate at the input of the buffer.

12. The computer program of claim 8, wherein the slew reference is the rise slew rate at the input of the buffer.

13. The computer program of claim 8, wherein the slew reference is the fall slew rate at the input of the buffer.

14. The computer program of claim 8, wherein the buffer is an independent rail pull up and rail pull down buffer.

15. A system for equalizing rise and fall slew rates at an output of a buffer, the system comprising:
    a buffer including a signal input, a signal output, and two control inputs;
    a pair of slew rate circuits for measuring, simultaneously, rise and fall slew rates at an input of the buffer and rise and fall slew rates at the output of the buffer, wherein the input of the buffer is the signal input and the output of the buffer is the signal output;
    a slew reference circuit for generating a slew reference based on at least one of the rise slew rate or the fall slew rate at the input of the buffer;
    a slew compare circuit for comparing the rise slew rate and the fall slew rate at the output of the buffer to the slew reference; and
    a control signal circuit for generating at least one of a rise control signal or a fall control signal for the two control inputs of the buffer, wherein the rise control signal and the fall control signal adjust the rise slew rate and the fall slew rate, respectively, at the output of the buffer to cause the rise slew rate to equal the fall slew rate at the output of the buffer.

16. The system of claim 15, wherein each of the slew rate circuits further comprises:
    a slew rate detection circuit for detecting, based on a high reference voltage and a low reference voltage, the rise slew rate and the fall slew rate in a time domain; and
    a slew measurement circuit for generating a voltage representation of the rise slew rate and the fall slew rate in the time domain.

17. The system of claim 16, further comprising:
    a voltage reference circuit for generating the high reference voltage and the low reference voltage, based on a supply voltage.

18. The system of claim 15, wherein the slew reference is an average of the rise slew rate and the fall slew rate at the input of the buffer.

19. The system of claim 15, wherein the slew reference is one of: the rise slew rate or the fall slew rate at the input of the buffer.

20. The system of claim 15, wherein the buffer is an independent rail pull up and rail pull down buffer.

* * * * *